United States Patent
Pinnow et al.

(10) Patent No.: US 7,692,175 B2
(45) Date of Patent: Apr. 6, 2010

(54) REACTIVE SPUTTERING PROCESS FOR OPTIMIZING THE THERMAL STABILITY OF THIN CHALCOGENIDE LAYERS

(75) Inventors: Cay-Uwe Pinnow, München (DE); Thomas Happ, Tarrytown, NY (US)

(73) Assignee: Qimonda AG, Munich (DE)

( * ) Notice: Subject to any disclaimer, the term of this patent is extended or adjusted under 35 U.S.C. 154(b) by 630 days.

(21) Appl. No.: 11/214,023

(22) Filed: Aug. 30, 2005

(65) Prior Publication Data

US 2006/0043354 A1  Mar. 2, 2006

(30) Foreign Application Priority Data

Aug. 30, 2004  (DE) .................. 10 2004 041 905

(51) Int. Cl.
*H01L 29/02* (2006.01)
(52) U.S. Cl. .................. 257/2; 257/E45.002; 257/4
(58) Field of Classification Search ............. 257/2–5, 257/35, E45.002, E45.004, E27.004; 365/148, 365/153, 163
See application file for complete search history.

(56) References Cited

U.S. PATENT DOCUMENTS

| | | | |
|---|---|---|---|
| 4,660,175 A * | 4/1987 | Strand .................. 365/113 |
| 5,069,747 A | 12/1991 | Cathey et al. | |
| 5,427,665 A | 6/1995 | Hartig et al. | |
| 6,509,066 B1 * | 1/2003 | Jost ................... 427/529 |
| 7,288,781 B2 * | 10/2007 | Kozicki .................. 257/4 |
| 2001/0002284 A1 * | 5/2001 | Kohler et al. ............ 427/488 |
| 2004/0165422 A1 * | 8/2004 | Hideki et al. ............ 365/163 |
| 2005/0002227 A1 * | 1/2005 | Hideki et al. ............ 365/163 |

FOREIGN PATENT DOCUMENTS

| | | |
|---|---|---|
| EP | 0 846 343 B1 | 8/1996 |
| JP | 09156950 A | 8/1995 |
| JP | 2000248356 A | 1/1999 |

OTHER PUBLICATIONS

R. Kojima et al, "Nitrogen Doping Effect on Phase Change Optical Disks", *Japan Journal of Applied Physics.*, vol. 37 (1998) pp. 2098-2103.

E. Broese et al., "Optical Properties of Quasi-Simultaneous Sputtered GexSe 1-x" *Journal of Non-Crystalline Solids*, 130 (1991), pp. 52-57.

(Continued)

*Primary Examiner*—Thomas L Dickey
*Assistant Examiner*—Fazli Erdem
(74) *Attorney, Agent, or Firm*—Edell, Shapiro & Finnan, LLC

(57) ABSTRACT

A chalcogenide layer includes a composition of compounds having the formula $M_m X_{1-m}$, where M denotes one or more elements selected from the group consisting of group IVb elements of the periodic system, group Vb elements of the periodic system and transition metals, X denotes one or more elements selected from the group consisting of S, Se and Te, and m has a value of between 0 and 1. The chalcogenide layer further includes an oxygen or nitrogen content in the range from 0.001 atomic % to 75 atomic %.

4 Claims, 6 Drawing Sheets

OTHER PUBLICATIONS

Hirose et al., Journal of Applied Physics, vol. 47, No. 6, 1976, pp. 2767 to 2772, "Polarity-dependent memory switching and behavior of Ag dendrite in Ag-photodoped amorphous $As_2S_3$ films."

M.N. Kozicki et al., Electrochemical Society Proceedings, vol. 99-13, 1999, pp. 298 to 309, Applications of Programmable Resistance Changes in Metal-Doped.

M.N. Kozicki et al., 2002, "Can Solid State Electrochemistry Eliminate the Memory Scaling Quandary?".

Moore et al. pp. 193-197, Sputtering of Chalcogenide coatings on the fluoride glass.

Conference: Kobe, Japan Sep. 4-8, 1995 SICI: 0022-3093 (1995605) 198/200: 2L. 680: 0PSU; 1-8 ISSN 0022-3093 Conference paper (English), p. Optical properties and structure of unhydrogenated, hydrogenated, and zinc-alloyed GexSe1-x films prepared by radiofrequency sputtering.

T. Petkova et al., Kinetics of vaccun sublimation and condensation of films from the SE-AG-I system, Thin Solid Films, 205(1991) 25-28.

M. N. Kozicki et al. "Nanoscale effects in devices basaed on chalcogenide solid solutions", Superlattices and Microstructures, vol. 27, No. 5/6,2000.

* cited by examiner

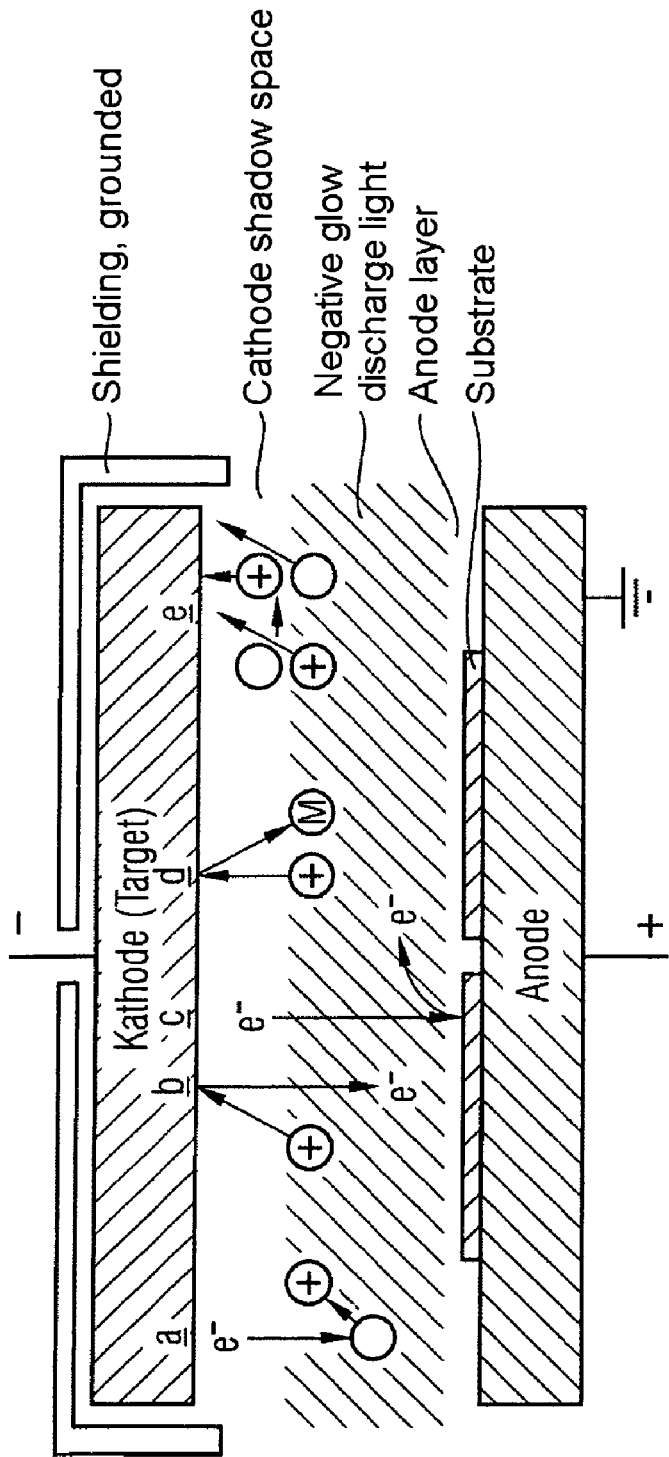

REACTIVE SPUTTERING PROCESS FOR OPTIMIZING THE THERMAL STABILITY OF THIN CHALCOGENIDE LAYERS

CROSS REFERENCE TO RELATED APPLICATIONS

This application claims priority under 35 USC §119 to German Application No. 10 2004 041 905.1 filed on Aug. 30, 2004 and titled "Reactive Sputtering Process for Optimizing the Thermal Stability of Thin Chalcogenide Layers," the entire contents of which are hereby incorporated by reference.

FIELD OF THE INVENTION

The present invention relates to nonvolatile memories and in particular to a semiconductor element including solid-state ion conductor memory cells, and to a method for fabricating it. In addition, the invention relates to resistively switching memory cells that include a chalcogenide layer doped with oxygen and/or nitrogen as an active layer.

BACKGROUND

A resistively operating nonvolatile memory cell has at least two different electrical resistances which can be assigned, for example, to the states "0" and "1". The memory cell may have a higher or lower electrical resistance depending on the applied voltage and can be switched between these two resistances.

One of the main aims in the further development of modern memory technologies is to increase the integration density, which means that it is very important to reduce the feature size of the memory cells on which the memory devices are based.

The technologies used, such as for example DRAM, SRAM or flash memories, have various drawbacks, such as for example volatility (DRAM), size (SRAM) or low endurance (number of possible write/read cycles). Hitherto, there has been no single technology that has been able to satisfy all the requirements for various applications.

Ionic solid-state memories are one of the highly promising technologies for nonvolatile memory cells. By way of example, it is known that certain metals, such as for example silver or copper, can be dissolved in chalcogenide glasses. The term glass is to be understood in very general terms as an amorphous, cooled melt, the atoms of which do not have a continuous long-range order, but rather only a locally limited crystalline arrangement (short-range order) in a three-dimensional unordered network.

Glasses may fundamentally be both electrical insulators, metals and electrical semiconductors, depending on whether free charge carriers are present and what ions are present in the glass and also on whether the ions that are present are able to move or are bonded. The conductivity of the chalcogenide glasses can be obtained, for example, by ions, such as for example sodium, lithium or silver ions, being incorporated in the glass. If metal ions are dissolved in the glass, the system can be considered as a "solid-state electrolyte" and the glass alone can be considered as a "solid-state ion conductor".

Chalcogenide glasses can be produced on the basis of the compounds of the general formula $M_mX_n$, where M denotes one or more elements or metals selected from the group consisting of group IVb of the periodic system, group Vb of the periodic system and transition metals, X denotes one or more elements selected from the group consisting of S, Se and Te, and m and n have a value of between 0 and 1. The indices m and n do not have to be integer numbers, since metals and elements may have a number of oxidation states present simultaneously. In accordance with the present invention, groups IVb and Vb are to be understood as meaning main groups IV and V, respectively, of the periodic system (groups 14 and 15 according to the new IUPAC nomenclature). The preferred elements or metals of these groups are Ge, Sn, Pb, As, Sb, Bi and Si.

One promising approach for the fabrication of resistive nonvolatile memory cells is based on the use of the solid solutions in chalcogenide glasses as active (switching) material for nonvolatile memory cells. A memory cell of this type has a layer of a chalcogenide glass arranged between a first electrode and a second electrode. In the simplest case, metal ions of the material forming one of the electrodes are dissolved in the layer of a chalcogenide glass.

Chalcogenide glass memory cells are based on an electrochemical redox process, in which metal ions of one electrode can reversibly diffuse into and out of the solid-state electrolyte material, thereby forming or dissolving a low-resistance path. More specifically, the material comprising chalcogenide glasses is arranged between two electrodes, with one electrode being designed as an inert electrode and the other electrode being designed as what is known as a reactive electrode. The ions of the reactive electrode are soluble in the chalcogenide glass.

The chalcogenide glasses are generally semiconductive. The dissolving of the metal ions in the chalcogenide glasses produces a solid solution of the corresponding ions in the glass. Silver ions can, for example, be dissolved by the deposition of an Ag film on a chalcogenide glass and subsequent irradiation. The irradiation of a sufficiently thick Ag film on $Ge_3Se_7$ produces, for example, a material of formula $Ag_{0.33}Ge_{0.20}Se_{0.47}$. Accordingly, the solutions may form by the photo-dissolution of silver in, for example, $As_2S_3$, $AsS_2$, $GeSe_2$.

In Hirose et al., *Journal of Applied Physics*, Vol. 47, No. 6, 1976, pp. 2767 to 2772, "*Polarity-dependent memory switching and behavior of Ag dendrite in Ag-photodoped amorphous $As_2S_3$ films*," an arrangement is described including an inert electrode of molybdenum or gold, a second electrode of silver and a layer of a chalcogenide glass of $As_2S_3$ photo-doped with $Ag^+$ ions arranged between the two electrodes. Applying a positive voltage to the Ag electrode, which voltage must be higher than what is known as a minimum threshold voltage, oxidizes the electrode, forces the $Ag^+$ ions into the chalcogenide glass and reduces them again in the solid-state electrolyte material or on the inert electrode, which leads to metallic deposits in the form of a conductive metal-rich path between the first and second electrodes. This lowers the electrical resistance of the arrangement. In this state, the electrical resistance of the solid-state electrolyte is reduced significantly (for example by several orders of magnitude) compared to the state without a metallic current path, thereby defining the ON state of the memory cell. If an oppositely polarized voltage is applied to the two electrodes, this leads to the formation of the metallic deposits or the current path being reversed, with the result that the two electrodes are no longer continuously electrically connected to one another, thereby defining the OFF state of the memory cell, since in this state the memory cell has a higher resistance than in the ON state.

Therefore, the general mechanism can be explained as being that the reactive electrode together with the solid-state electrolyte forms a redox system in which a redox reaction takes place above a defined threshold voltage ($V_{th}$). Depending on the polarity of the voltage which is applied to the two electrodes, although this voltage must be higher than the threshold voltage, the redox reaction can take place in one reaction direction or the other. Depending on the applied voltage, the reactive electrode is oxidized and the metal ions of the reactive electrode diffuse into the chalcogenide glass and are reduced in the solid-state electrolyte material or at the inert electrode. If metal ions are being continuously released into the solid-state electrolyte, the number and size of the metallic deposits increase until ultimately a metallic or semi-conducting low-resistance current path which bridges the two electrodes is formed (ON state). The electrolytic deposition ceases when so much metal has diffused in that the threshold voltage $V_{th}$ is undershot. If the polarity of the voltage is reversed, metal ions diffuse out of the chalcogenide glass and are reduced at the reactive electrode, which causes the metallic deposits located on the inert electrode to break down. This process is continued under the influence of the applied voltage until the metallic deposits which form the electrical path have been completely broken down (OFF state). The electrical resistance of the OFF state may be 2 to 6 orders of magnitude greater than the resistance of the ON state.

The implementation of individual switching elements which are based on chalcogenide glasses, such as $As_2S_3$, GeSe or GeS and $WO_x$, is known and published, e.g., in M. N. Kozicki et al., "*Superlattices and Microstructures*", Vol. 27, No. 5/6, 2000, pp. 485-488, M. N. Kozicki et al., *Electrochemical Society Proceedings*, Vol. 99-13, 1999, pp. 298-309, "Applications of Programmable Resistance Changes in Metal-Doped Chalcogenides" and M. N. Kozicki et al., 2002, "Can Solid State Electrochemistry Eliminate the Memory Scaling Quandary?".

The above-referenced publications propose depositing the solid-state electrolyte in a via hole (hole between two metallization levels of a semiconductor element) which has been etched vertically in a conventional inter-dielectric. Then, the material of the reactive electrode is deposited and patterned, for example by a suitable etching process or by chemical mechanical polishing (CMP). This is followed by a process which drives the material of the reactive electrode into the solid-state electrolyte in order to generate background doping of the solid-state electrolyte with the metal of the reactive electrode by UV irradiation.

However, the implementation of the memory cells based on the abovementioned chalcogenide materials brings with it serious problems, for example the fact that the limited thermal stability of the chalcogenide glasses requires special measures for back-end integration of a fully integrated memory. By way of example, Se-rich GeSe has a phase change at just 212° C., which throws up serious problems in particular for processing in the back-end sector (e.g., see Gokhale et al., *Bull, Alloy Phase Diagrams* 11 (3), 1990).

Hitherto, chalcogenide layers of the binary composition $M_mX_{1-m}$, where M denotes one or more elements or metals selected from the group consisting of group IVb of the periodic system, group Vb of the periodic system and transition metals, X denotes one or more elements selected from the group consisting of S, Se and Te, and m has a value of between 0 and 1, have been produced by evaporation coating processes (see, e.g., Petkova et al.: *Thin Solid Films* 205 (1991), 205; Kozicki et al.: *Superlattices and Microstructures*, Vol. 27, No. 5/6 (2000) 485-488) or by a sputtering process using suitable sputtering targets, such as for example by multi-source deposition (see, e.g., E. Broese et al., *Journal of Non-Crystalline Solids* (1991), Vol. 130, No. 1, p. 52-57), alloying targets (see, e.g., Moore et al., *Physics of Non-Crystalline Solids*, Taylor & Francis, London, UK, 1992, p. 193-197, xvi+761 pp 7 ref.; Conference: Moore et al.: *Conference paper (English)*, Cambridge, UK, 4-9 Aug. 1991 ISBN 0-7484-0050-8, M. W.; France et al. *Sputtering of Chalcogenide coatings on the fluoride glass*) or by a multi-component target (see, e.g., Choi et al.: *Journal of Non-Crystalline Solids* Elsevier: 1996, Vol. 198-200, pt. 2, p. 680-683, *Conference: Kobe*, Japan 4-8 Sep. 1995 SICI. 0022-3093 (1995605) 198/200: 2L. 680: OPSU; 1-8 ISSN 0022-3093 *Conference paper (English)*, P *Optical properties and structure of unhydrogenated, hydrogenated, and zinc-alloyed GexSe1-x films prepared by radiofrequency sputtering*).

Since the compounds of the composition $M_mX_{1-m}$ are completely miscible in the amorphous phase over the concentration range, it is possible to determine the composition by suitable selection of the material or sputtering target which is to be vaporized. The most important of these processes is sputtering deposition of these binary chalcogenide layers (e.g. Ge—Se or Ge—S) from a binary mixed target. The doping of the chalcogenide layer with nitrogen has only been described for ternary chalcogenide layers. For example, in Kojima et al.: "*Nitrogen Doping Effects on Phase Change Optical Discs, Jpn. J. Appl. Phys.* Vol. 27 (1998), p. 2098-2013), the effects of the chalcogenide layers caused by doping with nitrogen were investigated with regard to the optical properties of a recording medium.

One significant difficulty of the abovementioned chalcogenide materials is, as has already been mentioned above, an inadequate thermal stability for direct integration in a standard CMOS back-end-of-line (BEOL) process. The abovementioned binary layers, for a CMOS process, have to be treated at a temperature of approximately 430° C. for several hours, and therefore have to remain stable in the amorphous state during this time. However, it has been determined that a Ge—Se layer starts to form crystalline nuclei at temperatures of even just 150° C., and at 350° C. a matrix of Ge—Se compounds (with $Ag^+$ ions dissolved therein) crystallizes completely.

SUMMARY

An object of the present invention is to provide chalcogenide layers that are suitable for a nonvolatile resistive memory cell and can be integrated in the CMOS processes, where the layers must be able to withstand a temperature of 430° C. for several hours without changing significantly and in particular without crystallizing, on the one hand, and without permitting ions to diffuse into the chalcogenide layers, on the other hand.

Another object of the invention is to provide a process for depositing chalcogenide glass layers of the binary or multi-component composition $M_mX_{1-m}Y$ (Y stands for oxygen and/or nitrogen).

A further object of the invention is to provide memory cells with chalcogenide layers and a method for fabricating them which can be integrated in the CMOS processes.

The aforesaid objects are achieved individually and/or in combination, and it is not intended that the present invention be construed as requiring two or more of the objects to be combined unless expressly required by the claims attached hereto.

According to the invention, binary chalcogenide layers are provided comprising the composition $M_mX_{1-m}Y$, where Y is O, N, or $N_zO_{1-z}$, M denotes one or more elements or metals selected from the group consisting of group IVb of the periodic system, group Vb of the periodic system and transition metals, X denotes one or more elements selected from the group consisting of S, Se and Te, and m and z have a value of between 0 and 1. The binary chalcogenide layers are deposited by a reactive sputtering process or by a CVD process.

The above and still further objects, features and advantages of the present invention will become apparent upon consideration of the following detailed description of specific embodiments thereof, particularly when taken in conjunction with the accompanying drawings where like numerals designate like components.

BRIEF DESCRIPTION OF THE DRAWINGS

FIG. 2 diagrammatically depicts elementary processes in a sputtering chamber during the sputtering operation;

DETAILED DESCRIPTION

Figure 1A:
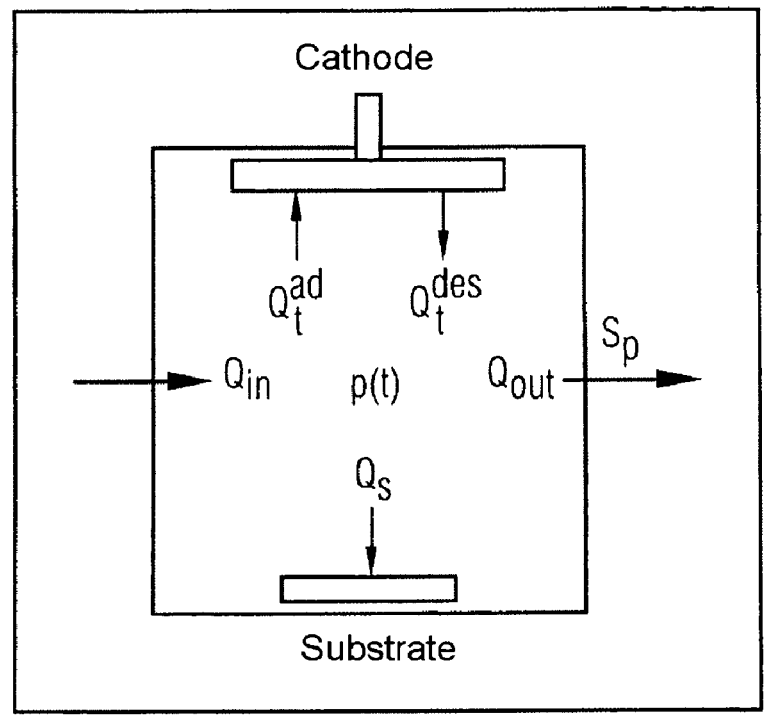
FIG. 1a diagrammatically depicts a gas sputtering process showing gas flows that occur during reactive sputtering.

In accordance with the invention, binary chalcogenide layers are provided including the composition $M_mX_{1-m}Y$, where Y is O, N, or $N_zO_{1-z}$, M denotes one or more elements or metals selected from the group consisting of group IVb of the periodic system, group Vb of the periodic system and transition metals, X denotes one or more elements selected from the group consisting of S, Se and Te, and m and z have a value of between 0 and 1. The binary chalcogenide layers are deposited by a reactive sputtering process or by a CVD process.

A reactive sputtering process is distinguished by the fact that the particles of the material which are to be deposited are thrown out of a sputtering target and enter into a reaction with the particles that are present in a reactive gas. One example of the reactive sputtering processes is the deposition of $SiO_2$, in which case Si particles are thrown out of the sputtering target, which consists of Si, and these particles then react with oxygen particles that are present in the gas to form an $SiO_2$ layer.

In the process according to the invention, sputtering targets consist of a chalcogenide compound, which is a binary, ternary or quaternary compound or includes more than four components, of the composition $M_mX_{1-m}$, where M denotes one or more elements or metals selected from the group consisting of group IVb of the periodic system, group Vb of the periodic system and transition metals, X denotes one or more elements selected from the group consisting of S, Se and Te and m has a value of between 0 and 1, and the reactive sputtering gas contains $O_2$, $O_3$, $N_2$ and/or other nitrogen-containing and/or oxygen-containing gaseous compounds, such as for example $N_2O$, NO, $NO_2$, $NO_x$, $H_2O$, $NH_3$.

In one preferred embodiment of the invention, the reactive sputtering gas is one constituent of a gas mixture which, in addition to the reactive sputtering gas, additionally contains a working gas. The working gas is not consumed during the sputtering, since the working gas does not react with the growing layer.

Preferred working gases are noble gases, namely He, Ne, Ar, Kr or a mixture thereof.

The partial pressure of the reactive gas in the mixture with the working gas is preferably in the range from approximately 1 μTorr to 500 mTorr.

The partial pressure of the working gas is preferably in the range from approximately 1 μTorr to 500 mTorr.

The partial pressures of the reactive gas and/or the working gas can be set by one or more suitable gas flow regulators and by the suction capacity of the system pumps at the sputtering chamber.

Exemplary sputtering parameters are as follows: the temperature in the range from 77 K-573 K, the sputtering power introduced from 50 W-20 kW and the substrate bias in the range from 0 V to 800 V.

Compared to conventional chalcogenide layers, the layers according to the invention have an increased oxygen and/or nitrogen content, which increases their thermal stability. Consequently, the layers according to the invention can be considered as the chalcogenide layers doped or alloyed with oxygen and/or with nitrogen of composition $M_mX_{1-m}Y$ (Y=O, N, $N_zO_{1-z}$), where M denotes one or more elements or metals selected from the group consisting of group IVb of the periodic system, group Vb of the periodic system and transition metals, X denotes one or more elements selected from the group consisting of S, Se and Te, and m and z have a value of between 0 and 1. These layers then have a ternary ($M_mX_{1-m}$:O; $M_mX_{1-m}$:N) or a quaternary $M_mX_{1-m}$:O:N composition. The oxygen or nitrogen content may be in the range from 0.001 to 75 atomic %.

The invention is explained on the basis of the example of the composition $Ge_mSe_{1-m}$, in which context it should be noted that this example also applies without restrictions to other target materials according to the invention of the composition $M_mX_{1-m}$, where M denotes one or more elements or metals selected from the group consisting of group IVb of the periodic system, group Vb of the periodic system and transition metals, X denotes one or more elements selected from the group consisting of S, Se and Te, and m has a value of between 0 and 1.

By selecting the sputtering target of the composition $Ge_mSe_{1-m}$, and by adding the reactive sputtering gas, which contains a nitrogen-containing gas and/or an oxygen-containing gas or consists of a nitrogen-containing gas and/or an oxygen-containing gas, in addition to a working gas (Ar), the layer growth can be represented by the following reaction equations:

Nitriding

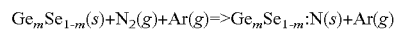

Oxidation

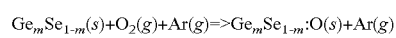

Simultaneous Oxidation and Nitriding

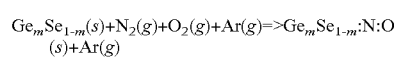

The colon in the above equations describes a doping or alloying of materials such as oxygen and nitrogen as further partners in the compound. Similar reaction equations also apply to other binary chalcogenide compounds and other oxygen-containing and/or nitrogen-containing, gaseous compounds.

Similarly, CVD processes are also possible for producing the layers; in these processes, the chalcogenide compounds and the nitrogen and oxygen are likewise provided in gaseous form.

The layer properties, such as for example homogeneity, stoichiometry, density, crystallinity, morphology and bonding to the substrate can be optimized by the process parameters, such as for example temperature, the sputtering power introduced, the substrate bias and the partial or total pressure of the reactive gas and/or the working gas.

In addition, it may be advantageous for the chalcogenide layer to be heat-treated further following the deposition process, e.g. by a furnace process in an inert atmosphere (for example comprising $N_2$ or Ar), in which undesired reactive gas components which may have diffused into the chalcogenide layer through kinetic processes during the sputtering (e.g. $H_2$ or Ar contamination in the layer) are expelled. Moreover, a heat treatment step of this type brings about an advantageous change to the structure and crystallinity.

Figure 1B:
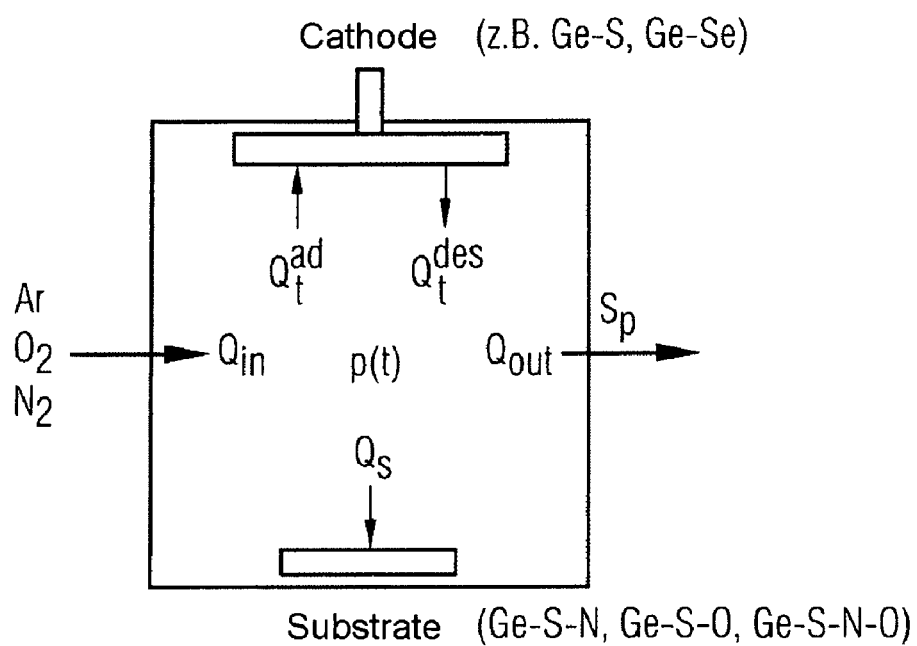
FIG. 1b diagrammatically depicts a sputtering process according to the invention with examples for the possible targets and for the reactive gases.

FIGS. 1A and 1B show gas flows that occur in a reactive sputtering process. The pressure p(t) which is established in the sputtering chamber depends on the suction capacity Sp of the system pumps and the reactive and nonreactive gas flows supplied. In this context, $Q_{in} = Q_{reactive} + Q_{nonreactive}$. The symbols used in the figures have the following meanings:

Q: gas flow, where the indices denote in: gas introduced into the chamber ad: gas adsorbed at the target surface des: quantity of gas desorbed from the target;

out: quantity of gas conveyed out of the chamber by pumping

S: gas absorbed by the substrate (i.e. by the growing layer).

FIG. 2 illustrates an example for the target material and for the reactive gases. However, the target may be any binary chalcogenide compound or chalcogenide compound including more than two components, and the reactive gas may contain one or more oxygen-containing and/or nitrogen-containing compounds or consist of one or more oxygen-containing and/or nitrogen-containing compounds, so that the reaction on the substrate results in a ternary chalcogenide layer ($M_m X_{1-m}$:O, $M_m X_{1-m}$:N) or a quaternary chalcogenide layer ($M_m X_{1-m}$:O:N).

As illustrated in FIG. 2, sufficient energy is supplied to a gas in the sputtering chamber, so that the gas is ionized and changes state from the gaseous state to the plasma state (a). According to the invention, the gas used in the sputtering chamber preferably contains "noble gases", such as for example helium, neon, argon or krypton, as working gas, and contains $N_2$, $O_2$, $O_3$ or other oxygen-containing or nitrogen-containing gases as reactive gas. The conversion of the gas in the sputtering chamber into the plasma state ionizes the gas molecules (b). The ionized gas ions formed in this way are accelerated by the electrical field and strike the surface of the target. On account of the elastic sputtering, the gas ions are back-scattered or penetrate into the solid body. In both cases, the projectile particle causes cascades of collisions in the target, with the result that the atoms or molecules are displaced from their lattice site in the solid body, and pass to the surface, leaving the solid body when the surface bonding energy is overcome (d). These neutral particles are either deposited on the substrate or can be ionized by colliding with positively charged gas ions and attracted back to the cathode by the electric field.

Figure 3:
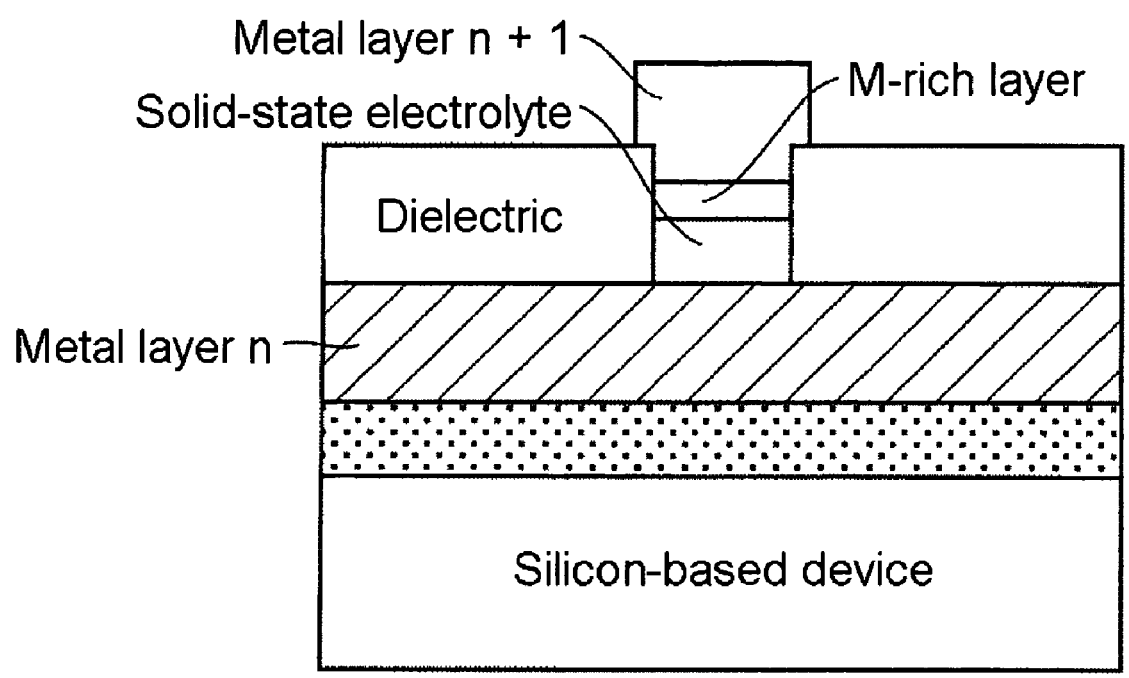
FIG. 3 depicts a cross-sectional view of a possible geometry of a memory cell according to the invention.

FIG. 3 illustrates a possible geometry of a nonvolatile solid-state electrolyte memory cell. The solid-state electrolyte is deposited in a via hole between two metallization levels which have been etched vertically in a conventional interdielectric. The use of chalcogenide compounds according to the invention causes a redox reaction to take place above a defined field voltage. Depending on the voltage applied, an electrode is oxidized and the metal ions diffuse into the chalcogenide glass and are then reduced at the second electrode. If metal ions are being continuously released into the chalcogenide glass, the number and size of the metallic precipitations increase until ultimately a metallic current path which bridges the two electrodes is formed, thereby producing a state of low electrical resistance. If the polarity of the voltage is reversed, metal ions diffuse out of the chalcogenide glass and are reduced at the first metallization level, which causes the metallic deposits located on the inert electrode to break down and produces the state of the high electrical resistance.

Figure 4:
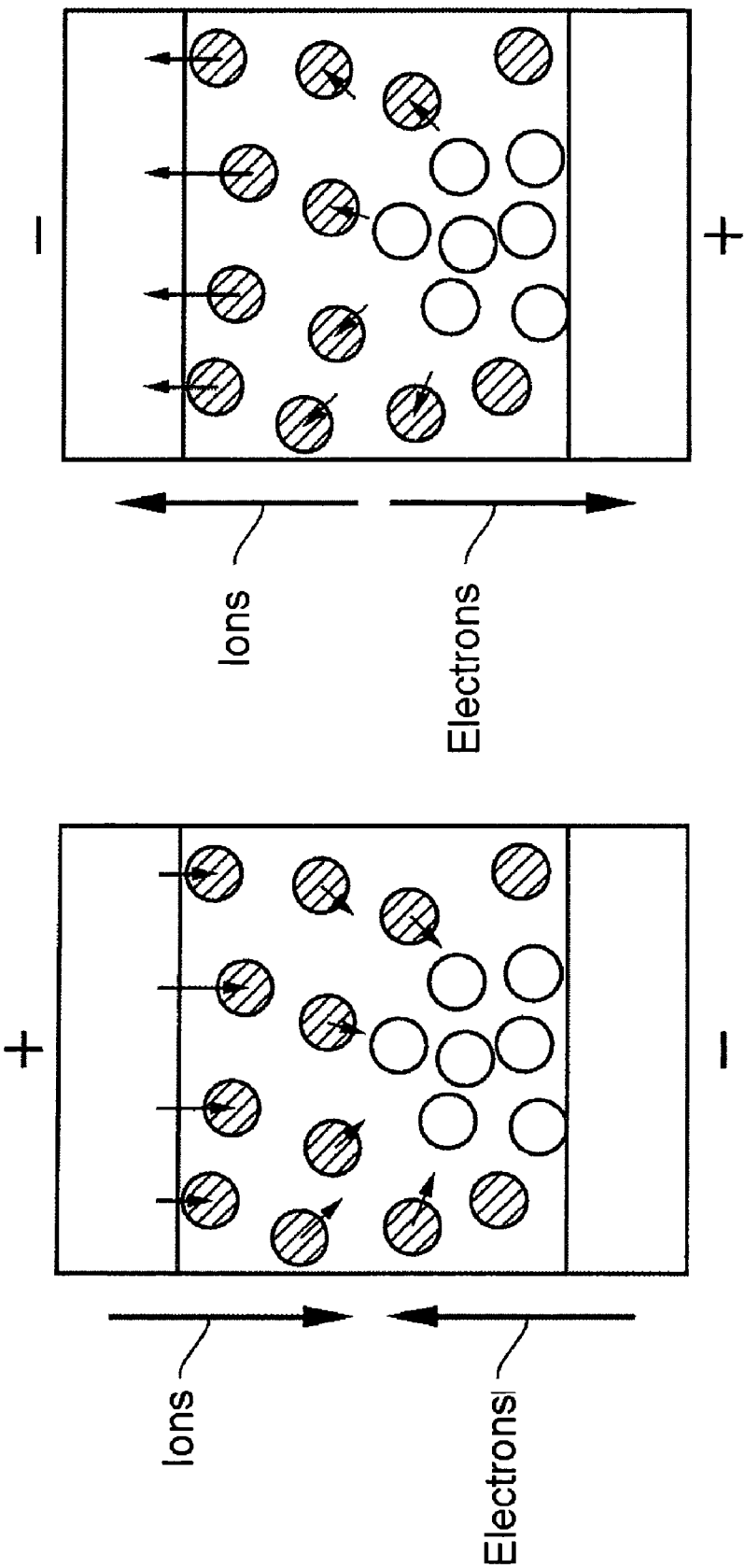
FIG. 4 diagrammatically depicts programming and erasing of a nonvolatile solid-state electrolyte memory cell.

The redox process is diagrammatically depicted in FIG. 4. Depending on the voltage applied, the nonvolatile solid-state electrolyte memory cell is programmed or erased; the reading takes place at a very low forward-bias voltage ($V_{read} \ll V_{write}$).

Figure 5:
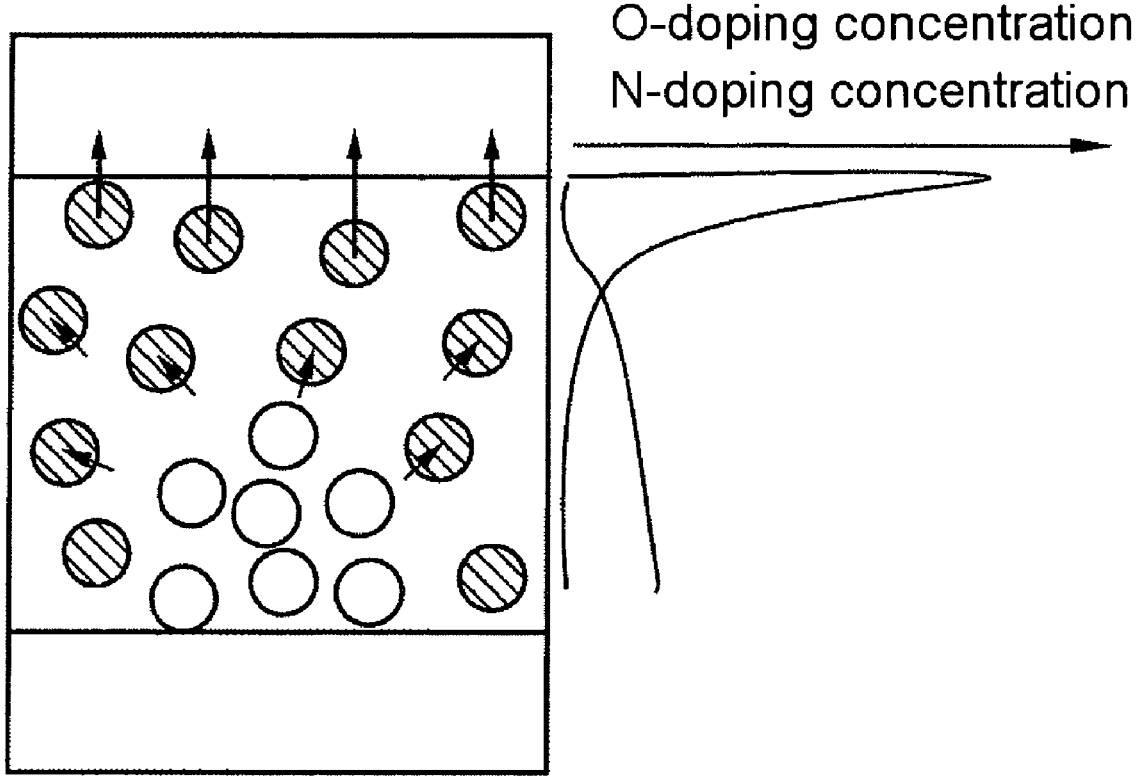
FIG. 5 diagrammatically depicts examples of O and N concentration gradients of a memory cell according to the invention.

FIG. 5 shows examples of O or N concentrations of the chalcogenide glass of a nonvolatile memory cell according to the invention in which the various concentrations of the partial pressure of the reactive gas have been set. The concentrations of the oxygen and nitrogen in the chalcogenide glass which are illustrated in FIG. 5 have a concentration gradient for both elements. In this case, the concentration of oxygen in the vicinity of the reactive electrode is significantly higher than in the vicinity of the inert electrode. By contrast, the concentration of nitrogen in the vicinity of the inert electrode is higher than in the vicinity of the reactive electrode. The concentrations of oxygen and nitrogen shown in FIG. 5 are only examples, since the concentrations of nitrogen and/or oxygen in the chalcogenide layer may also be homogenous.

Figure 6:
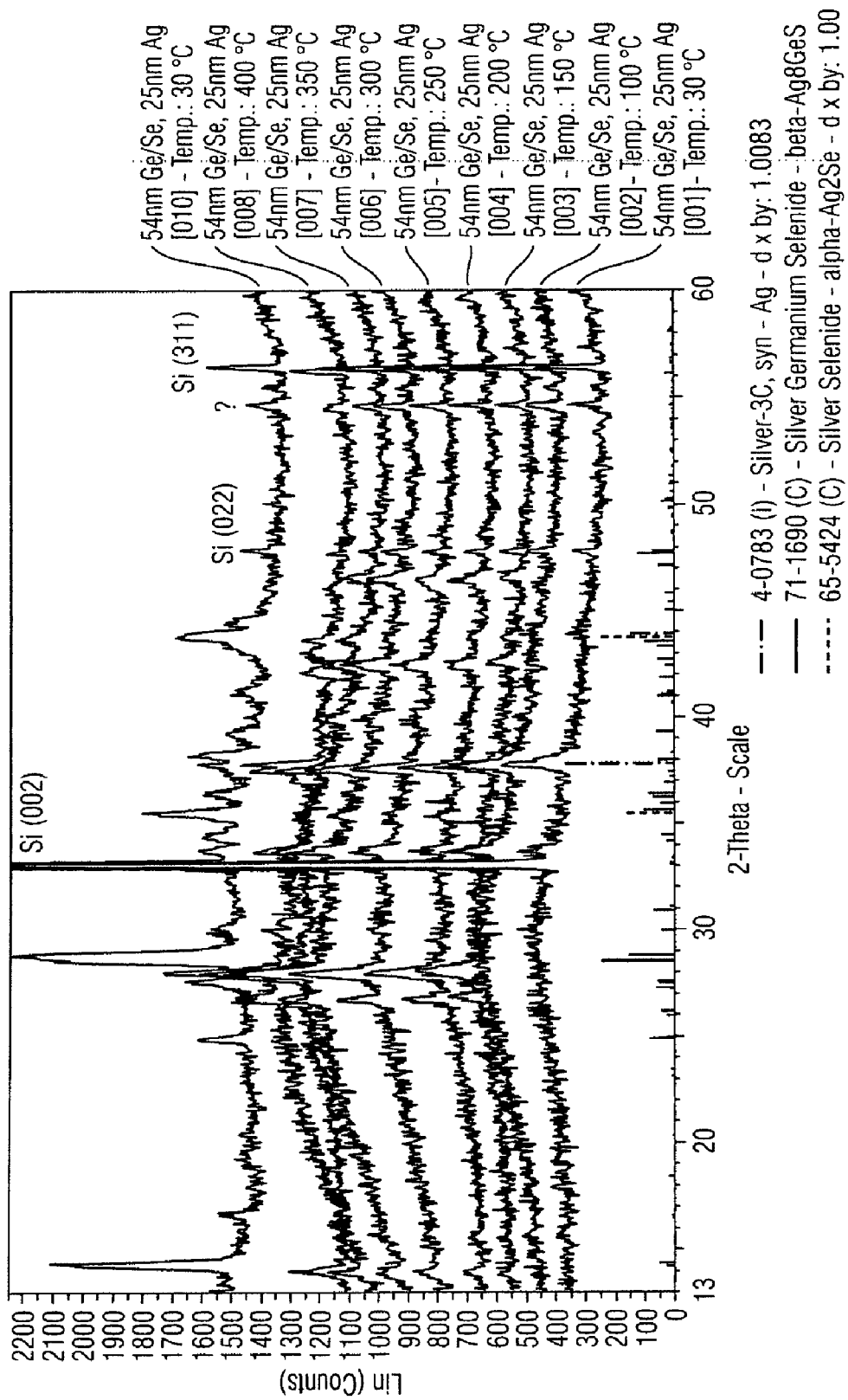
FIG. 6 is a diagram showing XRD spectra for the chalcogenide layers in the prior art.

FIG. 6 shows XRD spectra of a Ge/Se chalcogenide glass which has been produced by the process according to the prior art. The spectra clearly reveal that the formation of crystalline nuclei is observed from temperatures of just 150° C. upward, and the matrix of Ge/Se chalcogenide glass with $Ag^+$ ions dissolved therein has completely crystallized as a compound of formula $Ag_8GeSe_6$ beyond temperatures of 350° C.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A nonvolatile, resistively switching memory cell comprising a chalcogenide layer arranged between a first electrode and a second electrode, the chalcogenide layer including a composition of compounds having the formula $M_m X_{1-m}$:A, wherein M denotes at least one element selected from the group consisting of group IVb elements of the periodic system, group Vb elements of the periodic system and transition metal elements, X denotes at least one element selected from the group consisting of S, Se and Te, m has a value of between 0 and 1 and A is selected from the group consisting of O and N, and wherein the chalcogenide layer includes ions of a metal from which one of the electrodes is formed.

2. The nonvolatile, resistively switching memory cell of claim 1, wherein the first electrode comprises one of tantalum, copper, aluminum, silver, lithium, sodium and a compound of at least two of tantalum, copper, aluminum, silver, lithium and sodium.

3. The nonvolatile, resistively switching memory cell of claim 1, wherein the second electrode comprises one of gold, tungsten, titanium, Ti—Si, titanium nitride, platinum, tantalum, tantalum nitride, Ta—Si—N, carbon, tungsten, TaW, WCN and WN.

4. The nonvolatile, resistively switching memory cell of claim 1, wherein the memory cell operates according to the conductive bridging principle.

* * * * *